(12) United States Patent
Mauder et al.

(10) Patent No.: US 8,999,783 B2
(45) Date of Patent: Apr. 7, 2015

(54) METHOD FOR PRODUCING A SEMICONDUCTOR DEVICE WITH A VERTICAL DIELECTRIC LAYER

(71) Applicant: Infineon Technologies Austria AG, Villach (AT)

(72) Inventors: Anton Mauder, Kolbermoor (DE); Franz Hirler, Isen (DE); Andreas Meiser, Sauerlach (DE)

(73) Assignee: Infineon Technologies Austria AG, Villach (AT)

( * ) Notice: Subject to any disclaimer, the term of this patent is extended or adjusted under 35 U.S.C. 154(b) by 39 days.

(21) Appl. No.: 13/760,446

(22) Filed: Feb. 6, 2013

(65) Prior Publication Data

US 2014/0220758 A1 Aug. 7, 2014

(51) Int. Cl.
| | |
|---|---|
| *H01L 21/8242* | (2006.01) |
| *H01L 21/336* | (2006.01) |
| *H01L 21/20* | (2006.01) |
| *H01L 21/31* | (2006.01) |
| *H01L 21/469* | (2006.01) |
| *H01L 49/02* | (2006.01) |
| *H01L 29/66* | (2006.01) |

(52) U.S. Cl.
CPC .......... *H01L 28/40* (2013.01); *H01L 29/66734* (2013.01)

(58) Field of Classification Search
CPC .................................................. H01L 21/7688
See application file for complete search history.

(56) References Cited

U.S. PATENT DOCUMENTS

| | | | |
|---|---|---|---|
| 2003/0013259 A1* | 1/2003 | Chidambarrao et al. ..... | 438/301 |
| 2012/0056241 A1* | 3/2012 | Sumitomo et al. ........... | 257/139 |
| 2012/0146133 A1 | 6/2012 | Hirler | |
| 2012/0286355 A1 | 11/2012 | Mauder et al. | |

FOREIGN PATENT DOCUMENTS

DE    102011051670 A1    11/2012

* cited by examiner

*Primary Examiner* — Michael Jung
(74) *Attorney, Agent, or Firm* — Murphy, Bilak & Homiller, PLLC

(57) ABSTRACT

A method for producing a semiconductor device is disclosed. The method includes providing a semiconductor body having a first surface, and a second surface opposite the first surface, producing a first trench having a bottom and sidewalls and extending from the first surface into the semiconductor body, forming a dielectric layer along at least one sidewall of the trench, and filling the trench with a filling material. Forming the dielectric layer includes forming a protection layer on the least one sidewall such that the protection layer leaves a section of the at least one sidewall uncovered, oxidizing the semiconductor body in the region of the uncovered sidewall section to form a first section of the dielectric layer, removing the protection layer, and forming a second section of the dielectric layer on the at least one sidewall.

18 Claims, 9 Drawing Sheets

METHOD FOR PRODUCING A SEMICONDUCTOR DEVICE WITH A VERTICAL DIELECTRIC LAYER

TECHNICAL FIELD

Embodiments of the present invention relate to a method for producing a semiconductor device, in particular a semiconductor device with a vertical material layer.

BACKGROUND

Several types of semiconductor devices include a semiconductor body (die) and a vertical dielectric layer in the semiconductor body, that is a dielectric layer extending in a vertical direction of the semiconductor body. A vertical dielectric layer can be used as a capacitor dielectric in a capacitor or as a gate dielectric or field electrode dielectric in a MOS transistor.

To produce a dielectric layer extending in a vertical direction in a semiconductor body, it is possible to produce a trench that is subsequently filled with the desired material. However, producing a very thin layer which additionally extends deeply into the semiconductor body is difficult by using such a method since a trench having a high aspect ratio (ratio of depth to width of the trench) would have to be produced for this purpose. Such a trench having a high aspect ratio either can only be produced in a costly manner or cannot be economically produced at all above a specific aspect ratio, for example, greater than 500:1 or 1000:1.

A relatively new type of a vertical power device that is known as TEDFET (Trench Extended Drain Field-Effect Transistor) includes a drift region and a drift control region that are dielectrically insulated from one another by a drift control region dielectric. In this device, the drift control region controls a conducting channel in the drift region when the device is driven in the on state. In order to be able to control the conducting channel effectively, the thickness of the drift control zone dielectric should be as small as possible. Furthermore, it is desirable that the drift control region dielectric extends over the entire length of the drift region which extends in the vertical direction of the semiconductor body of the device.

In particular in a TEDFET operation scenarios may occur in which the electric field across the dielectric layer should be lower at some locations of the dielectric layer than at other locations. In order to prevent the dielectric layer from being damaged, the dielectric layer should be thicker at those locations where a reduced electric field across the dielectric layer is required.

There is therefore a need to provide a method for producing a semiconductor device with a vertical dielectric layer, in particular a vertical dielectric layer that has thickness that varies along the length of the dielectric layer.

SUMMARY

A first embodiment relates to a method for producing a semiconductor device. The method includes providing a semiconductor body having a first surface, and a second surface opposite the first surface, producing a first trench having a bottom and sidewalls and extending from the first surface into the semiconductor body, forming a dielectric layer along at least one sidewall of the trench, and filling the trench with a filling material. Forming the dielectric layer includes forming a protection layer on the least one sidewall such that the protection layer leaves a section of the at least one sidewall uncovered, oxidizing the semiconductor body in the region of the uncovered sidewall section to form a first section of the dielectric layer, removing the protection layer, and forming a second section of the dielectric layer on the at least one sidewall.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

In the following Detailed Description, reference is made to the accompanying drawings, which form a part thereof, and in which is shown by way of illustration specific embodiments in which the invention may be practiced.

Figure 1A:
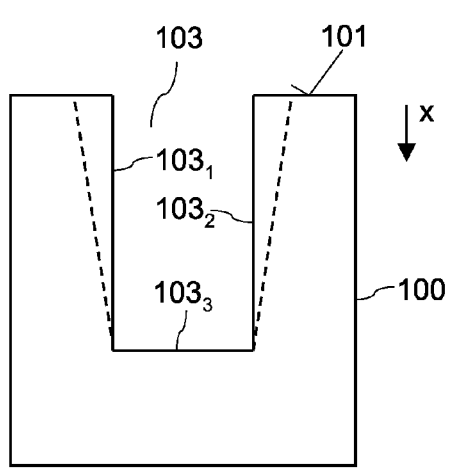
FIG. 1 (which includes FIGS. 1A to 1G) illustrates a first embodiment of a method for producing a semiconductor device with a vertical dielectric layer.
Figure 1B:
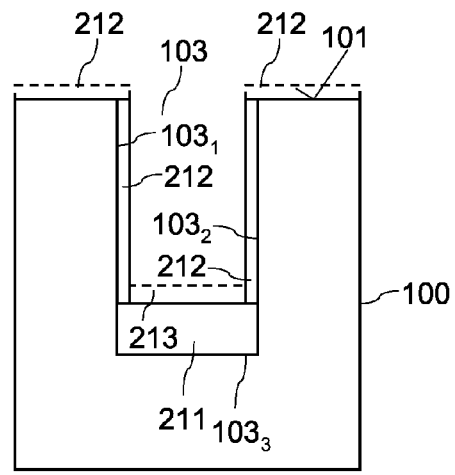
Figure 1C:
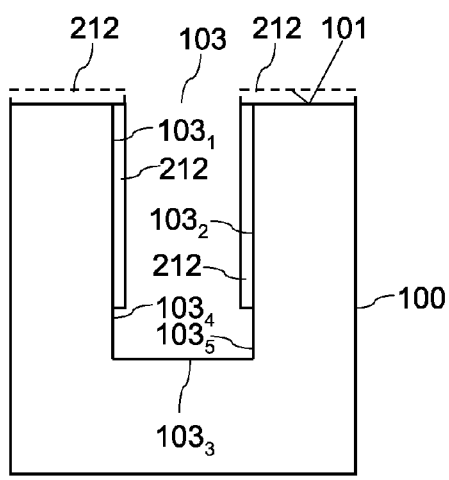
Figure 1D:
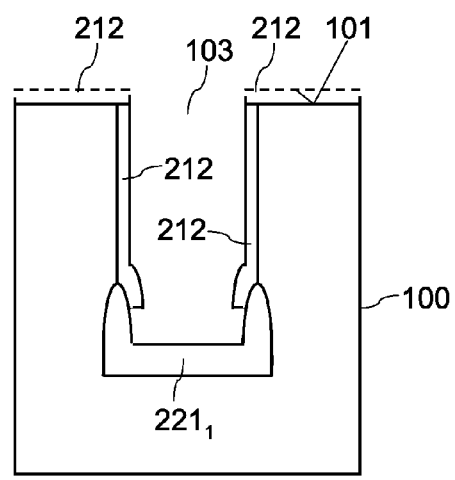
Figure 1E:
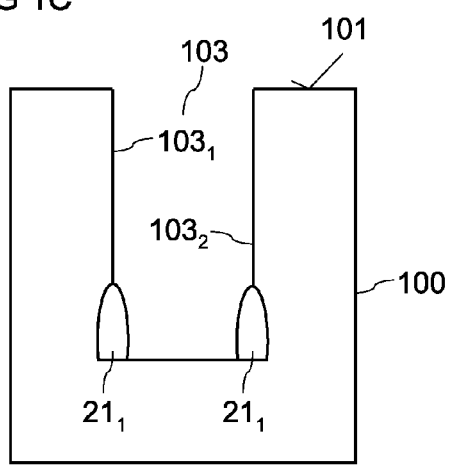
Figure 1F:
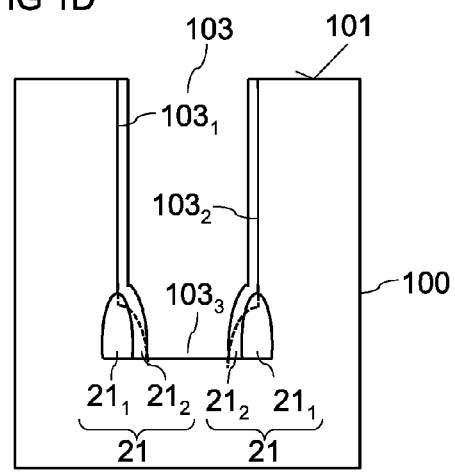
Figure 1G:
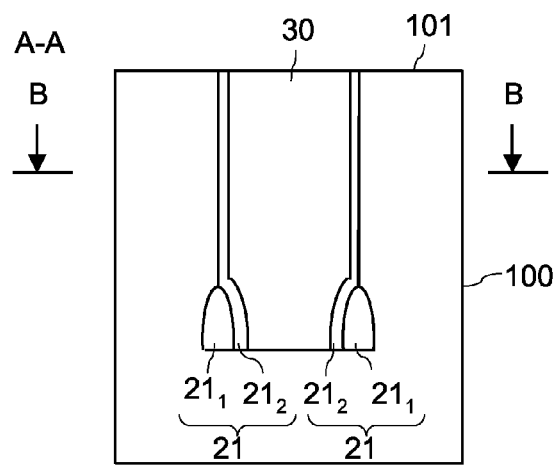

FIGS. 1A to 1G illustrate one embodiment of a method for producing a vertical dielectric layer in a semiconductor body 100. FIGS. 1A to 1G each schematically illustrate a cross section through part of the semiconductor body 100. The semiconductor body 100 has a first surface 101; the sectional plane illustrated in FIGS. 1A 1G is a vertical sectional plane and thus runs perpendicular to the first surface 101.

The semiconductor body 100 extends in a vertical direction. The vertical direction is the direction running perpendicular to the first surface 101. The semiconductor body 100 additionally extends in a first lateral direction and in a second lateral direction, which each run perpendicular to the vertical direction. In the figures, the first lateral direction is, for example, a direction running in the plane of the drawing and perpendicular to the vertical direction, and the second lateral direction runs, for example, perpendicular to the plane of the drawing illustrated and perpendicular to the vertical direction.

The semiconductor body 100 may include a conventional semiconductor material, such as silicon (Si), silicon carbide (SiC), gallium arsenide (GaAs), gallium nitride (GaN) or the like.

The method explained below serves for producing a vertical dielectric layer. In this explanation, a "vertical dielectric layer" is a layer that extends in the vertical direction x within the semiconductor body. To "extend in the vertical direction" means that the dielectric layer has at least one direction component that runs in the vertical direction x of the semiconductor body 100. Thus, a dielectric layer having a vertical extension should be understood to mean a layer which either runs perpendicular to the first side 101, so that an angle between the first surface 101 and the material layer is 90°, or which is inclined relative to the first surface 101, so that the angle between the first surface 101 and the material layer is less than 90° and more than 0°, in particular more than 45°, or even more than 60°.

In the explanation below, a "dielectric layer" should be understood to mean a layer composed of only one material, or a layer composed of different materials, such as a layer including a layer stack with at least two sub-layer, wherein the sub-layers include different materials.

Referring to FIG. 1A, the method includes forming a first trench 103 having sidewalls $103_1$, $103_2$ and a bottom $103_3$ and extending from the first surface 101 into the semiconductor body 100. Forming the first trench 103 may include a conventional process for forming a trench in a semiconductor body, such as an anisotropic etching process or a Bosch etching process using an etch mask (not illustrated in FIG. 1A).

In the embodiment illustrated in FIG. 1A, the first trench 103 has vertical sidewalls $103_1$, $103_2$, that is the sidewalls $103_1$, $103_2$ are perpendicular to the first surface 101. However, this is only one example. It is also possible to produce the first trench 103 with beveled sidewalls (illustrated in dashed lines in FIG. 1A). In this case, an angle (specifically a smaller one of the two angles defined between the sidewalls and the first surface 101) is between 0° and 90°, and in particular between 60° and 90°. In the embodiment of FIG. 1A, the trench with beveled sidewalls narrows towards the bottom $103_3$. However, it is also possible to implement a trench with beveled sidewalls that widens towards the bottom $103_3$. The orientation of the sidewalls $103_1$, $103_2$ defines the orientation of the at least one dielectric layer formed in the method; this will become apparent from the further explanation provided below.

Referring to FIG. 1C, the method further includes forming a protection layer 212 on at least one of the sidewalls such that the protection layer 212 leaves a section $103_4$, $103_5$ of the at least one sidewall uncovered. In the present embodiment, a protection layer 212 is formed on the two opposite sidewalls $103_1$, $103_2$ illustrated in FIG. 1C, wherein the protection layer 212 on each of the sidewalls $103_1$, $103_2$ leaves a section $103_4$, $103_5$ of the corresponding sidewall $103_1$, $103_2$ uncovered. In the embodiment of FIG. 1C, the uncovered sidewall sections $103_4$, $103_5$ are sidewall sections that adjoin the bottom $103_3$.

Referring to FIG. 1B, forming the protection layers 212 on the opposite sidewalls $103_1$, $103_2$ may include forming a plug 211 on the bottom $103_5$ of the first trench 103. This plug 211 also covers those sidewall sections $103_4$, $103_5$ that should not be covered by the protection layer 212. A thickness of the plug 211 in the vertical direction of the semiconductor body 100 defines the vertical dimension of the uncovered sidewall sections $103_4$, $103_5$. According to one embodiment, the plug 211 includes an oxide, such as a High Density Plasma (HDP) oxide. An HDP oxide can be produced in a deposition process such that the HDP oxide plug 211 essentially covers the bottom $103_5$ and adjoining sidewall sections, but leaves upper sidewall sections uncovered. Those sidewall sections covered by the plug 211 will be referred to as lower sidewall sections in the following.

Referring to FIG. 1B, the protection layer 212 is formed after forming the plug 211. According to one embodiment, the protection layer 212 includes a nitride. The protection layer 212 may be formed in a deposition process.

Referring to FIG. 1C, the plug 211 is removed after the protection layer 212 has been formed. Removing the plug 211 may include a selective etching process in which the plug 211 is etched selectively relative to the material of the semiconductor body 100 and the material of the protection layer 212.

In the case that the protection layer 212 is formed using a deposition process, a section 213 of the protection layer may also be formed on the plug 211. Protection layer 213 formed on the plug 211 is illustrated in dashed lines in FIG. 1B. This protection layer 213 on the plug 211 has to be removed before the plug 211 can be etched. Removing the protection layer 213 from the plug 211 may include an anisotropic etching process.

As illustrated in dashed lines in FIGS. 1B and 1C (and also in FIG. 1D explained below) the protection layer 212 and the material of the plug 211 (not shown in FIG. 1D) can also be formed on the first surface 101.

Referring to FIG. 1E, first dielectric layer sections $21_1$ are formed on the uncovered sidewall sections $103_4$, $103_5$. These first dielectric layer sections $21_1$ may include an oxide formed by a thermal oxidation process.

Referring to FIG. 1D, forming the first dielectric layer sections $21_1$ may include thermally oxidizing the bottom $103_3$ and the uncovered sidewall sections $103_4$, $103_5$ so as to form an oxide layer $221_1$ on the bottom $103_3$ and the uncovered sidewall sections $103_4$, $103_5$. In this thermal oxidation process, the oxide layer $221_1$ can be produced such that upper ends of the oxide layer $221_1$ extend below lower ends of the protection layer 212. The oxide layer $221_1$ is then removed from the bottom $103_3$, leaving the first dielectric layer sections $21_1$ along the uncovered sidewall sections $103_4$, $103_5$. When the protection layer 212 is also formed on the first surface 101, the protection layer 212 not only protects those sidewall sections covered by the protection layer 212 from being oxidized, but also protects the first surface 101. In the case that the first surface 101 is not covered by the protection layer 212, the first surface 101 is oxidized in the oxidation process so that an oxide layer is formed on the first surface 101. This oxide layer (not shown) on the first surface 101 can be removed in the same process steps in which the oxide layer is removed from the bottom $103_3$ of the first trench 103. Removing the oxide layer $221_1$ from the bottom $103_3$ may include an anisotropic etching process. Referring to FIG. 1E, the protection layer 212 is removed before or after the first dielectric layer sections $21_1$ have been formed.

Referring to FIG. 1F, a second dielectric layer section $21_2$ is formed on those sections of the sidewalls $103_1$, $103_2$ that were covered by the protection layer 212. Forming the second dielectric layer section $21_2$ may include a deposition process in which the second dielectric layer section $21_2$ is deposited on the at least one sidewall of the first trench 103. In the embodiment illustrated in FIG. 1F, the second dielectric layer section $21_2$, like the first dielectric layer section $21_1$, is formed on both opposite sidewalls $103_1$, $103_2$ that are illustrated in FIGS. 1A to 1G. The deposition process for forming the second dielectric layer section $21_2$ may include one of a CVD (Chemical Vapor Deposition) process, and an ALD (Atomic Layer Deposition) process. As illustrated in FIG. 1F, forming the second dielectric layer section $21_2$ using a deposition process may include forming the second dielectric layer section $21_2$ on those sidewall sections that were previously covered by the protection layer 212 and on the first dielectric layer section $21_1$. Such a deposition process may also include the deposition of a dielectric layer on the first surface 101 and on the bottom $103_3$ of the first trench 103. Those dielectric layers that are optionally deposited on the first surface 101 and on the bottom $103_3$ are removed after the deposition process using, for example, an anisotropic etching process. The thickness of the second dielectric layer $21_2$ may be substantially homogeneous as shown in FIG. 1F. However, it is also possible to implement the second dielectric layer $21_2$ such that a thickness varies. For example, the thickness may decrease towards the bottom $103_3$. During removal of the second dielectric layer $21_2$ from the bottom $103_3$ also portions of the second dielectric layer $21_2$ on top of the first dielectric layer $21_1$ and parts of the first dielectric layer $21_1$ may be removed as indicated by the dashed lines in FIG. 1F.

Referring to FIG. 1G, the first trench 103 is finally filled with a filling material. The filling material can be semiconductor material, in particular a monocrystalline semiconductor material 30. Filling the first trench 103 with a monocrystalline semiconductor material may include an epitaxial process, in particular a selective epitaxial process in which the semiconductor material 30 is monocrystalline grown on the bottom $103_3$ of the trench until the trench has been completely filled. The semiconductor material 30 can be doped during the growth process in a conventional manner. It is even possible to produce several layers of the filling material 30 that have different doping concentrations. Optionally, the first surface 101 is polished or planarized after the first trench 103 has been filled with the semiconductor material 30.

The semiconductor filling material may correspond to the material of the semiconductor body 100, or may be different from the material of the semiconductor body 100. Further, a polycrystalline semiconductor material instead of a monocrystalline semiconductor material may be used.

Although the filling material 30 is a semiconductor material (semiconducting material) in the embodiment explained above and in the embodiments explained below, it should be noted that a conductor material (a conducting material) may be used as a filling material as well. A suitable conducting material is, for example, a metal (e.g., aluminum (Al), copper (Cu), nickel (Ni), titanium (Ti), gold (Au), or silver (Ag)), a nitride (e.g., titanium nitride (TiNi), tantalum nitride (TaNi)), carbon (C), a metal silicide, a conducting ceramics, or a conducting polymer. It is even possible to fill the trench with a layer stack comprising a plurality of semiconducting or conducting layers. These layers can be vertical layers (layers parallel to the trench sidewalls $103_1$, $103_2$), or horizontal layers (layers parallel to the trench bottom $103_3$).

The filling material 30 at least partially fills the trench. That is, the filling material 30 completely fills the trench, or may leave voids surrounded by the filling material.

The filling material 30 explained before finally fills the trench after the first and second dielectric layers $21_1$, $21_2$ have been formed. According to one embodiment, the trench is temporarily closed using a sacrificial filling material. This sacrificial filling material may completely fill the trench or may only form a cover closing the trench. According to one embodiment, the sacrificial filling material includes one of a semiconductor oxide (such as $SiO_2$), carbon, or a semiconductor nitride (such as SiNi). While the sacrificial filling material temporarily closes the trench, the semiconductor body 100 may be subject to additional processing steps. The sacrificial filling material is then removed from the trench and the final filling material is produced on the first and second dielectric layers $21_1$, $21_2$ as explained before.

Referring to FIG. 1G, the method explained with reference to FIGS. 1A to 1G results in a semiconductor body 100 including at least one vertical dielectric layer 21 extending from the first surface 101 into the semiconductor body 100. The at least one dielectric layer 21 has a varying thickness such that the at least one dielectric layer 21 is thicker in those regions in which the first dielectric layer section $21_1$ and the second dielectric layer section $21_2$ are arranged. In the present embodiment, the thicker region of the at least one vertical dielectric layer 21 is in the lower region of the former trench 103, that is in a region adjoining the bottom $103_3$ of the first trench 103.

In FIGS. 1A to 1G two opposite sidewalls $103_1$, $103_2$ of the first trench 103 are shown, while other sidewalls of the first trench 103 are out of view. The vertical dielectric layer 21 is formed on at least one of the sidewalls of the first trench 103, but can also be formed on each of the sidewalls of the first trench 103. The shape of the vertical dielectric layer 21 in a horizontal plane of the semiconductor body 100 is dependent on the shape (geometry) of the first trench 103. Some embodiments of different trench geometries are explained with reference to FIGS. 2 to 4 herein below. Each of these figures shows a horizontal cross sectional view of one section of a semiconductor body 100 in which a vertical dielectric layer 21 has been formed along sidewalls of a first trench.

Figure 2:
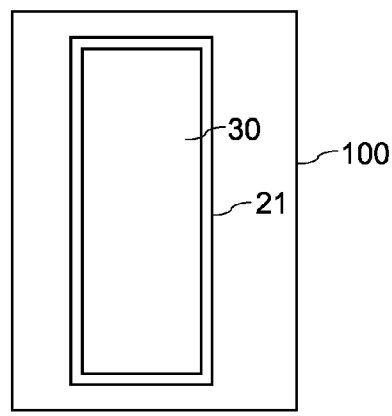
FIG. 2 illustrates a horizontal cross sectional view of the semiconductor body of FIG. 1G according to a first embodiment.

In the embodiment illustrated in FIG. 2, the vertical dielectric layer 21 has the form of a rectangular ring in the horizontal section plane B-B. Such a vertical dielectric layer 21 can be formed using a method in which a first trench 103 with a rectangular horizontal cross section is formed and in which the vertical dielectric layer 21 is formed along each of the sidewalls of this first trench. However, it is also possible to form the vertical dielectric layer 21 only on one of the sidewalls of the first trench, or even only on one section of one sidewall of the first trench.

Figure 3:
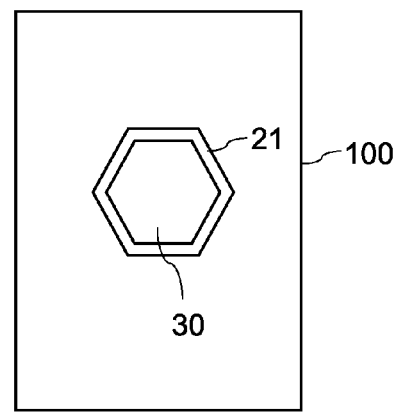
FIG. 3 illustrates a horizontal cross sectional view of the semiconductor body of FIG. 1G according to a second embodiment.

FIG. 3 illustrates a further embodiment. In this embodiment, the vertical dielectric layer 21 has the form of a hexagonal ring in the horizontal section plane B-B. Forming this vertical dielectric layer 21 may include a process in which the first trench 103 is formed with a hexagonal horizontal cross section. Instead of the trench with a rectangular horizontal cross section (as illustrated in FIG. 2), or with a hexagonal horizontal cross section (as illustrated in FIG. 3), a first trench with any other horizontal cross section, such as an elliptical, circular or other polygonal horizontal cross section can be formed as well.

Figure 4:
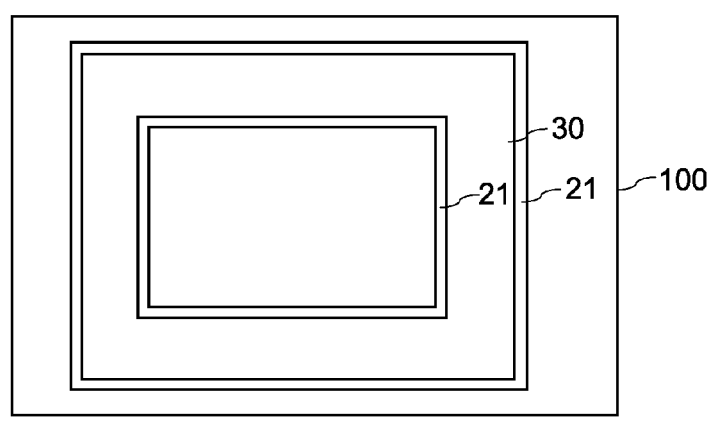
FIG. 4 illustrates a horizontal cross sectional view of the semiconductor body of FIG. 1G according to a third embodiment.

FIG. 4 illustrates a further embodiment. In this embodiment, the first trench 103 has the form of a rectangular ring and the vertical dielectric layer 21 is produced along each of the sidewalls of this first trench 103. Thus, the semiconductor body 100 includes two vertical dielectric layers 21 each having the form of a rectangular ring, wherein the two vertical dielectric layers 21 are distant to each other such that one vertical dielectric layer forms an inner ring, while the other vertical dielectric layer forms an outer ring. Instead of the trench ring with a rectangular horizontal cross section (as illustrated in FIG. 4) a trench ring with any other horizontal cross section, such as an elliptical, circular or other polygonal horizontal cross section can be formed as well. Instead of only one trench ring, two or more trench rings stacked into one another could be produced.

Figure 5A:
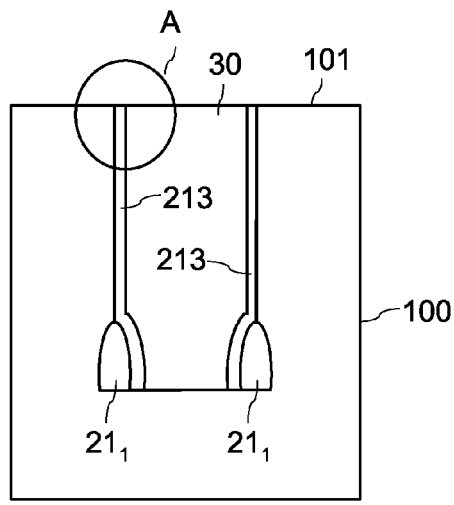
FIG. 5 (which includes FIGS. 5A to 5C) illustrates a modification of the method of FIG. 1.
Figure 5A:
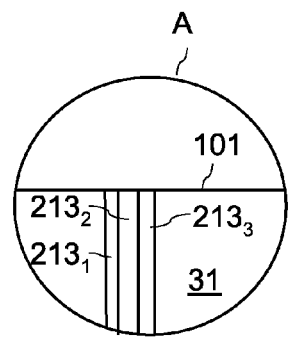
Figure 5B:
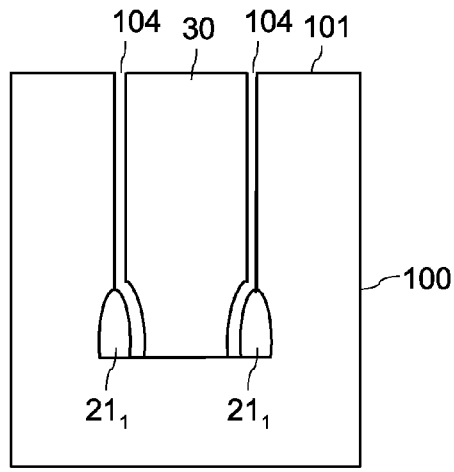
Figure 5C:
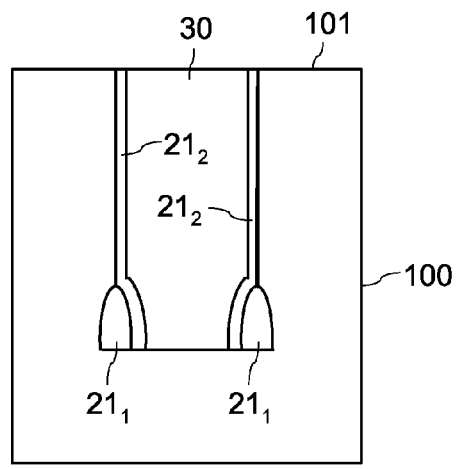

FIGS. 5A to 5C illustrate a modification of the method explained with reference to FIGS. 1A to 1G before. FIG. 5A illustrates a vertical cross sectional view of a semiconductor structure that is similar to the structure of FIG. 1G, and that has been formed through a modified method. In this modified method, a sacrificial layer 213 instead of the second dielectric layer section $21_2$ (see FIG. 1F) is formed on the at least one sidewall and the first dielectric layer section $21_1$ before filling the first trench with the semiconductor material 30. Referring to detail A illustrated in FIG. 5A, the sacrificial layer 213 may include a first layer $213_1$ on the sidewall of the trench, a second layer $213_2$ on the first layer, and a third layer $213_3$ on the second layer $213_1$. According to one embodiment, the first and third layer $213_1$, $213_3$ are oxide layers, while the second layer $213_2$ is a carbon layer. According to a further embodiment, not illustrated, a sacrificial layer comprising only one material, such as carbon, is formed.

Referring to FIG. 5B, the sacrificial layer 213 is at least partially removed, so as to form a trench 104 between the filling semiconductor material 30 and the material of the semiconductor body 100. When, for example, the sacrificial layer 213 includes a carbon layer $213_2$ between two oxide layers $213_1$, $213_3$ partially removing the sacrificial layer 213 may include a high temperature or a plasma enhanced process that ashes (burns) the carbon layer $213_2$ for example in an oxygen or hydrogen containing atmosphere. During removal of the carbon layer $213_2$, the two oxide layers $213_1$, $213_3$ may prevent or at least slow down the diffusion of the reactive gas atmosphere to the semiconductor interface and prevent a substantial growth of the thickness of oxide layers $213_1$, $213_3$ or an attack of the semiconductor surface by the gas atmosphere. However, it is also possible to selectively etch the sacrificial layer 213 or parts of the sacrificial layer 213 selectively relative to the filling semiconductor material 30 and the material of the semiconductor body 100. When a layer stack with a carbon layer $213_2$ and oxide layers $213_1$, $213_3$ is used, it is also possible to ash the carbon layer $213_2$, and to etch the oxide layers $213_1$, $213_3$.

Referring to FIG. 5C, the second dielectric layer section $21_2$ is formed in the second trench 104. Forming the second dielectric layer section $21_2$ may include an oxidation process. In this case, the second dielectric layer section $21_2$ is an oxide layer (that is thicker than a width of the trench 40).

FIGS. 6A to 6E illustrate a further modification of the method explained with reference to FIGS. 1A to 1F for forming the first and second dielectric layer sections $21_1$, $21_2$.

Figures 6A, 6B:
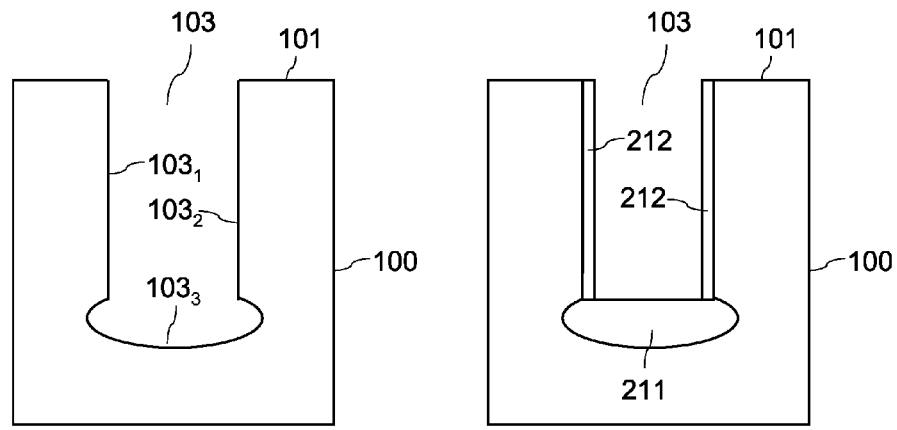
FIG. 6 (which includes FIGS. 6A to 6E) illustrates a second embodiment of a method for producing a semiconductor device with a vertical dielectric layer.
Figures 6C, 6D:
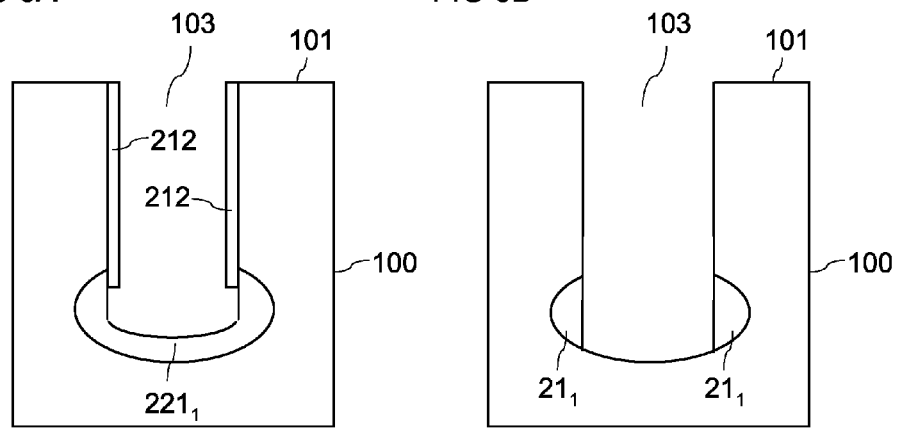
Figure 6E:
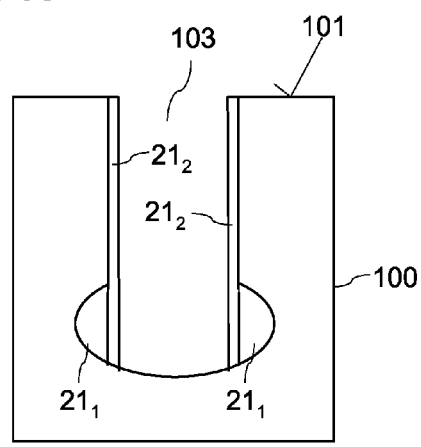

Referring to FIG. 6A, in this method, the first trench 103 is formed such that the first trench 103 is wider in a lower region, i.e. the region closer to the bottom $103_3$ of the first trench 103 than closer to the first surface 101. Forming the first trench 103 may include two etching processes, namely an anisotropic etching that forms a first section of the first trench 103, and an isotropic etching process that etches the bottom of the first section and results in the widened lower trench section. According to a further embodiment, a Bosch etching process is used to form the first trench 103. It is commonly known that a Bosch etching process includes an alternating sequence of isotropic etching processes, passivation of the trench sidewalls using a polymer and an anisotropic removal of the passivation from the bottom of the trench produced so far, where each of these isotropic etching processes etches the trench deeper into the semiconductor body. A first trench 103 as illustrated in FIG. 6A can be produced using a Bosch etching process by performing one or several etching processes at the end of the sequence of isotropic etching processes longer than the previous isotropic etching processes.

The further method steps correspond to the method steps explained with reference to FIGS. 1B to 1F before. That is, a plug 211 is formed on the bottom $103_3$ of the first trench 103 and the protection layer 212 is formed at least one of the sidewalls of the first trench 103 (see FIG. 6B); the plug 211 is removed from the bottom of the first trench 103, and uncovered regions of the semiconductor body 100 within the first trench 103 are oxidized (as to form an oxide layer $221_1$) (see FIG. 6C); the oxide layer $221_1$ is removed from the bottom $103_3$ of the first trench 103 (see FIG. 6D); and the second dielectric layer section $21_2$ is formed on uncovered sections of the sidewalls and optionally on the first dielectric layer section $21_1$ (see FIG. 6E). Alternatively, a sacrificial layer instead of the second dielectric layer section $21_2$ can be formed, as explained with reference to FIGS. 5A to 5C before.

Figure 7:
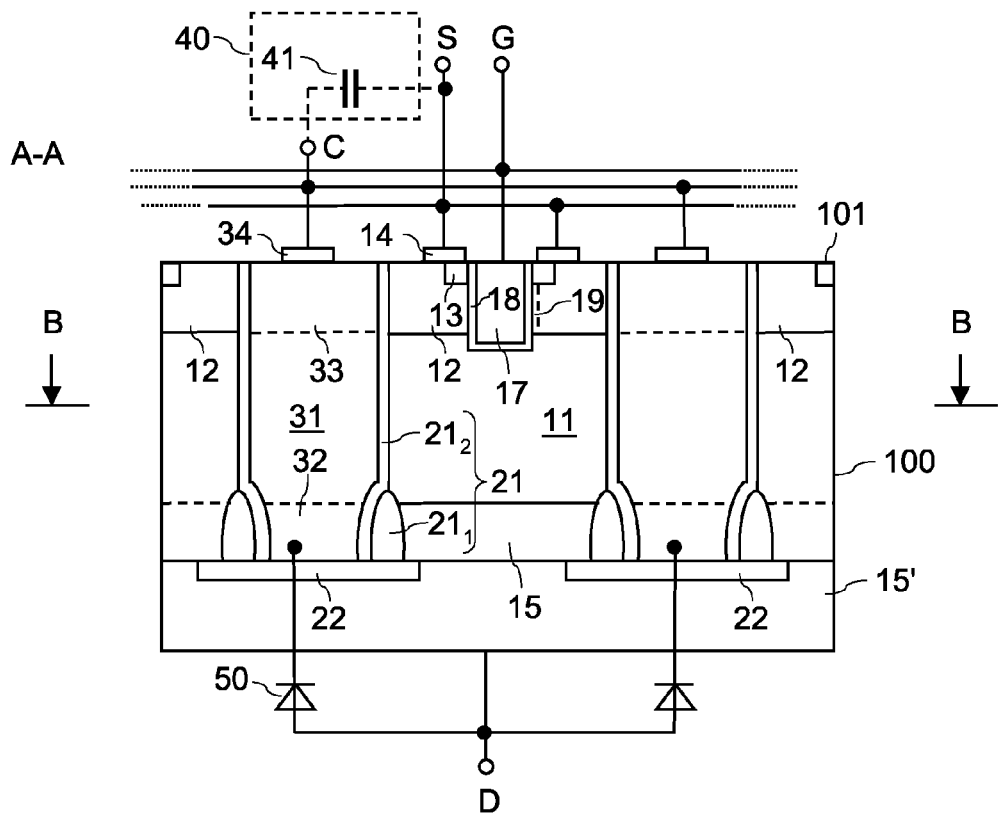
FIG. 7 illustrates a vertical cross sectional view of a semiconductor device which includes vertical dielectric layers.

FIG. 7 illustrates a vertical cross sectional view of a semiconductor device that includes vertical dielectric layers which each include two vertical dielectric layer sections $21_1$, $21_2$. The vertical dielectric layers of the semiconductor device of FIG. 7 correspond to the vertical dielectric layers explained with reference to FIGS. 1A to 1G. However, other vertical dielectric layers explained herein before may be used as well.

The semiconductor device of FIG. 7 is a MOSFET, specifically a vertical MOSFET. That is, a current flow direction of the MOSFET corresponds to a vertical direction of the semiconductor body 100 in which active device regions of the MOSFET are implemented. Referring to explanation herein before, the "vertical direction" of the semiconductor body 100 is a direction perpendicular to the first surface 101 of the semiconductor body 100. FIG. 7 shows a vertical cross sectional view of the MOSFET, or, more precisely, a vertical cross sectional view of the semiconductor body 100.

Referring to FIG. 7, the MOSFET includes a drift region 11, a body region 12, a source region 13, and a drain region 15. The source and drain regions 13, 15 are spaced apart in the current flow direction (which is the vertical direction of the semiconductor body 100 in the present embodiment). The body region 12 is arranged between the source region 13 and the drift region 12, and the drift region 11 is arranged between the body region 12 and the drain region 15. The drain region 15 is electrically connected to drain terminal D (only schematically illustrated in FIG. 7). The source region 13 and the body region 12 are electrically connected to a source electrode 14 which forms or which is connected to the source terminal S.

The drift region 11, the body region 12, the source region 13, and the drain region 15 form active device regions of the MOSFET and are implemented in the semiconductor body 100. The active device regions are monocrystalline semiconductor regions according to one embodiment. The source electrode 14 may include a polycrystalline semiconductor material, a silicide, a metal or another conductive material.

The MOSFET further includes a gate electrode 17 adjacent the body region 12 and dielectrically insulated from the body region 12. In the embodiment of FIG. 7, the gate electrode 17 is arranged in a trench and extends from the source region 13 through the body region 12 to or into the drift region 11. The gate electrode 17 is dielectrically insulated from these semiconductor regions by a gate dielectric 18 and is connected to the gate terminal G. The gate dielectric 18 can be a conventional gate dielectric and includes, for example, an oxide, a nitride, or a high-k dielectric.

The MOSFET of FIG. 7 is not restricted to be implemented with the gate electrode 17 in a trench. The MOSFET could also be implemented with a conventional planar gate electrode (not shown) that is arranged above the first surface 101.

The MOSFET can be implemented as an n-type MOSFET or as a p-type MOSFET. In an n-type MOSFET, the source region 13 and the drain region 15 are n-doped, while the body region 12 is p-doped. In a p-type MOSFET, the source region 13 and the drain region 15 are p-doped while the body region 12 is n-doped. The doping concentration of the source region and the drain regions 13, 15 is, for example in the range of between $5\,E17\,cm^{-3}$ and $1\,E21\,cm^{-3}$. The doping concentration of the body region 12 is, for example, in the range of between $5\,E16\,cm^{-3}$ and $5\,E18\,cm^{-3}$. The doping concentration of the drift region 11 is, for example, in the range of between $1\,E12\,cm^-$ and $1\,E15\,cm^{-3}$.

Further, the MOSFET can be implemented as an enhancement (normally-off) MOSFET or as a depletion (normally-on) MOSFET. In an enhancement MOSFET, the body region 12, that is complementary doped to the source region 13, extends to the gate dielectric 18. In a depletion MOSFET, the body region 12 at least along the gate dielectric 18 includes a channel region 19 (illustrated in dashed lines along one side of the gate electrode 17 in FIG. 7) of the same doping type as the source region 13.

In the type of MOSFET illustrated in FIG. 2, the drift region 11 can have the same doping type as the source region 13 and the drain region 14, or can be doped complementarily to the source region 13 and the drain region 14. In the latter case, at least one section of the drift region 11 between a dielectric layer 21 which will be explained in the following and a channel region of the MOSFET may have the same doping type as the source region 13. The "channel region" of the MOSFET is a region of the body region 12 along the gate dielectric 18 where the gate electrode 17 controls a conducting channel.

Referring to FIG. 7, the MOSFET further includes a drift control region 31 that is dielectrically insulated from the drift region 11 by a vertical dielectric layer 21 with a first and a second dielectric layer section $21_1$, $21_2$ as explained before. The dielectric layer 21 will be referred to as drift control region dielectric 21 in the following. The drift control region dielectric 21 extends in the current flow direction. Thus, in the embodiment illustrated in FIG. 7, the drift control region dielectric 21 is a vertical dielectric layer extending in the vertical direction of the semiconductor body 100. The drift control region 31 is configured to generate a conducting channel in the drift region 11 along the drift control region dielectric 21 when the MOSFET is in an on-state. This conducting channel helps to reduce the on-resistance of the MOSFET. The MOSFET, like a conventional MOSFET, is in the on-state, when an electrical potential is applied to the gate terminal G that induces a conducting channel in the body region 12 between the source region 13 and the drift region 15 along the gate dielectric 18, and when an electrical voltage is applied between the drain and the source terminals D, S. e.g., in an n-type enhancement MOSFET, the voltage to be applied between the gate terminal G and the source terminal S is a positive voltage higher than a threshold voltage of the MOSFET. The conducting channel along the gate control region dielectric 21 is an accumulation channel when the drift region 11 has the same doping type as the source and drain regions 13, 15, and the conducting channel is an inversion channel, when the drift region 11 is doped complementarily to these source and drain regions 13, 15.

The MOSFET may further include a semiconductor region 33 doped complementarily to the source and drain regions 13, 15 of the MOSFET and adjoining the drift control region 31 at a source-sided end of the drift control region 31. In an n-type MOSFET, the semiconductor zone 33 is p-doped, and in a p-type MOSFET, the semiconductor zone 33 is n-doped. The drift control region 31 or the optional semiconductor region 33 is connected to a control terminal C via a connection electrode 34. For electrically connecting the drift control region 31 or the semiconductor region 33 to the contact electrode 34, the drift control region 31 or the semiconductor region 33, respectively, may include a more highly doped contact region (not illustrated) of the same the doping type as the drift control region 31 or the semiconductor region 33, respectively. This contact region is contacted by the contact electrode 34.

The doping concentration of the drift control region 31 may correspond to the doping concentration of the drift region 11. The doping type of the drift control region 31 may correspond to the doping type of the drift region 11, or may be complementary to the doping type of the drift region. According to one embodiment, the drift control region 31 and the drift region 11 are intrinsic.

The control terminal C is operable to be coupled to a biasing source (charging source). The biasing source 40 is configured to bias the drift control region 31 such that a conducting channel is generated in the drift region 11 along the gate control region dielectric 21 when the MOSFET is in the on-state. In an arrangement with an n-type MOSFET, the biasing source 40 is configured to charge the drift control region 31 such that the drift control region 31 assumes an electrical potential higher than the electrical potential of the drift region 11, when the MOSFET is in an on-state. In this case, an electron channel (as an accumulation or an inversion channel, dependent on the doping type of the drift region 11) is generated in the drift region 11 along the drift control region dielectric 21. In an arrangement with a p-type MOSFET, the biasing source 40 is configured to charge the drift control region 31 such that the drift control region assumes an electrical potential lower than the electrical potential of the drift region 11. In this case, a hole channel is generated along the drift control region dielectric 21. The biasing source 40 can be implemented in many different ways.

According to one embodiment (not illustrated) the control terminal C is coupled to the gate terminal G through a diode. Further, a capacitive storage element 41 is connected between the control terminal C and the source terminal. In this case, the drift control region 31 is charged by a gate drive terminal (not illustrated). In the off-state of the MOSFET, the capacitive storage element 41 (that is shown in FIG. 7) serves to store charge carriers from the drift control region 31. In the on-state, these charge carriers are needed in the drift control region 31 for controlling (generating) the conducting channel in the drift region 11 along the drift control region dielectric 21. This is explained in further detail below. Storing charges from the drift region 31 in the capacitive storage element during off-periods of the MOSFET and providing these charges from the capacitive storage element to the drift region 31 when the MOSFET is switched on helps to reduce switching losses. The reduction of switching losses is, in particular, an issue at high switching frequencies.

Further, the MOSFET may include a rectifier element 50, such as a diode, connected between the drain region 15 and a drain-sided end of the drift control region 31. The drift control region 31 extends along the drift region in a current flow direction of the MOSFET. The "drain-sided end" of the drift control region 31 is the end that is located towards the drain region 15 (or drain electrode 15') of the MOSFET. Consequently, a "source-sided end" of the drift control region 31 is the end that is located towards the source region 13 (or source electrode 14) of the MOSFET. Optionally, the rectifier element 50 is connected to a connection region 32 which has the same doping type as the source and drain regions 13, 15, so that the connection region 32 is n-doped in an n-type MOSFET and p-doped in a p-type MOSFET. The connection region 32 has a higher doping concentration than the drift control region 31. The doping concentration of the connection region 32 is, for example, in the range of between 10 E18 cm$^{-3}$ and 10 E21 cm$^{-3}$.

Referring to FIG. 7, a drain electrode 15' is electrically connected to the drain region 15. The drain electrode 15' does not only contact the drain region 15, but is also adjacent the drift control region 31 at the drain-sided end of the MOSFET. At the drain-sided end, a dielectric layer 22 is arranged between the drift control region (or the optional region 31) and the drain region 15 and dielectrically insulates the drift control region 31 from the drain electrode 15' in this region of the MOSFET.

The basic operating principle of the MOSFET of FIG. 7 is now explained. For explanation purposes it is assumed that the MOSFET is an n-type enhancement MOSFET with an n-doped drift region 11, and that the drift control region 31 has the same doping type as the drift region 11. In this case, the biasing source 40 is configured to bias the drift control region 31 to have a positive potential relative to the electrical potential of the source terminal S (source potential), when the MOSFET is in the on-state. The MOSFET is in the on-state, when the drive potential applied to the gate terminal G generates a conducting channel in the body region 12 between the source region 13 and the drift region 11. In the on-state, the drift control region 31, which has a higher electrical potential than the drift region 11, generates an accumulation channel in the drift region 11 along the drift control region dielectric 21. This accumulation channel significantly reduces the on-resistance of the MOSFET as compared to a MOSFET without a drift control region. When the drift region 11 is doped complementarily to the source and drain regions 13, 15, the drift control region generates an inversion channel in the drift region 11 along the drift control region dielectric 21.

The MOSFET is in the off-state, when the channel along the gate dielectric 18 in the body region 12 is interrupted. In this case, a depletion region expands in the drift region 11 beginning at a pn-junction between the body region 12 and the drift region 11. The depletion region expanding in the drift region 11 causes a depletion region also to expand in the drift control region 31, which, like the drift region 11, may include a monocrystalline semiconductor material. By virtue of a depletion region expanding in the drift region 11 and a depletion region expanding in the drift control region 31, a voltage across the drift control region dielectric 21 is limited.

In the off-state of the MOSFET, the capacitive storage element 41 serves to store electrical charges that are required in the drift control region 31 when the MOSFET is in its on-state. These charges are positive charges in an n-type MOSFET and can be provided by the semiconductor zone 33. In a manner not illustrated in FIG. 7, the capacitive storage element 40 may be integrated partially or completely in the drift control region 31 or the semiconductor region 33.

The rectifier element 50 allows charge carriers that are thermally generated in the drift control region 31 to flow to the drain region 15, in order to prevent an electrical potential of the drift control region 31, namely at the lower end of the drift control region 31 or optional connection region 32, to increase in an uncontrolled manner. The rectifier element 50 therefore operates as a voltage limiting elements that limits a voltage difference between the electrical potential of the drift control region 31 and the drain electrode 15'. This rectifier element 50 is connected up such that in the on-state of the MOSFET the drift control region 31 may assume a higher electrical potential than the potential at the drain terminal D.

The MOSFET can be implemented with a cell-like structure and may include a plurality of transistor cells connected in parallel. Each transistor cell includes a source region 13, a body region 12, a drift region 11, a drain region 15, a gate electrode 17, a gate dielectric 18, a drift control region dielectric 21 and a drift control region 31, where each of these device regions may be shared by two or more transistor cells. The individual transistor cells are connected in parallel by having their source regions 13 connected to a common source terminal S, by having their drain regions 15 connected to a common drain terminal D, and by having their gate electrodes 17 connected to a common gate terminal G.

Referring to FIG. 7, each drift control region dielectric 21 includes two dielectric layer sections $21_1$, $21_2$ and has a varying thickness such that the drift control region dielectric 21 is thicker in a region adjoining the drain region 15. At the end of the manufacturing process of the device it may become necessary to test the drift control region dielectric 21 for failures. For this, a voltage may be applied between the drain electrode 15' and the control terminal C. Usually, this test voltage is higher than the maximum operating voltage. During test and normal operation a lateral electric field is built up in the vertical dielectric layer sections $21_1$, $21_2$ and a vertical and lateral electric field is built up in the insulating dielectric layer 22.

The dielectric layer 22 may be manufactured using only low temperature process steps. Thus, the dielectric layer 22 and the junction to dielectric layer sections $21_1$, $21_2$ may exhibit therefore much lower quality than e.g. dielectric layer section $21_2$. Therefore the maximum permissible electric field strength in this region is reduced.

Since the thickness of the dielectric layer sections $21_1$, $21_2$ is higher than the thickness of the dielectric layer $21_2$ alone, the electric field stress in the adjoining insulating layer 22 and in the dielectric sections $21_1$, $21_2$ are smaller than the electric field stress in the dielectric layer $21_2$.

Figure 8:
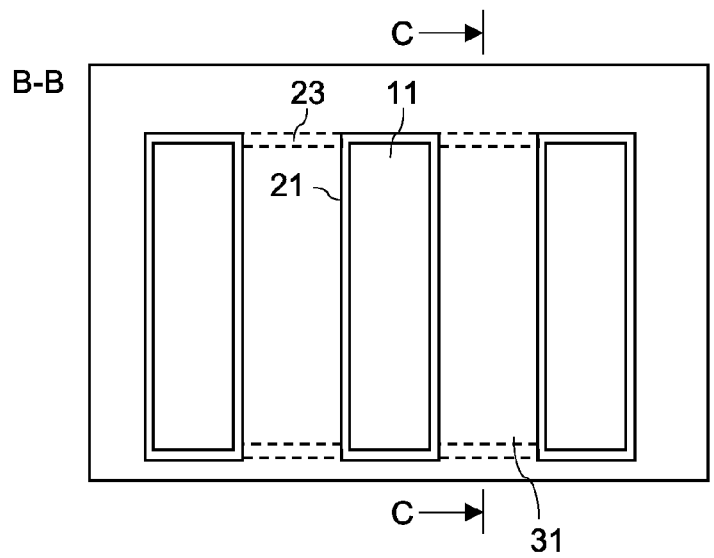
FIG. 8 illustrates a horizontal cross sectional view of the semiconductor device of FIG. 4 according to a first embodiment.
Figure 9:
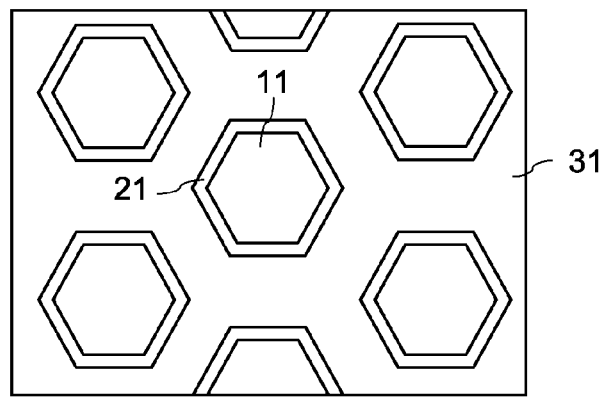
FIG. 9 illustrates a horizontal cross sectional view of the semiconductor device of FIG. 4 according to a second embodiment.

FIGS. 8 and 9 each show horizontal cross sectional views of the MOSFET of FIG. 7 in a horizontal section plane B-B that goes through the drift region 11 and the drift control region 31.

Referring to FIG. 8, the drift regions 11 of the individual transistor cells may have a longitudinal (stripe or elongated) shape in the horizontal plane. One drift control region 31 may surround the individual drift regions 11, wherein each drift region 11 is surrounded by one drift control region dielectric 21. According to a further embodiment (illustrated in dashed lines in FIG. 8) there is a plurality of drift control regions 31 having a longitudinal shape, with each drift control region 31 being terminated by further dielectric layers 23 at the longitudinal ends. According to yet another embodiment (not shown), the drift region 11 surrounds the individual drift control regions 31, wherein each of the drift control regions 31 is surrounded by a drift control region dielectric 21.

Referring to FIG. 9, the drift regions 11 of the individual transistor cells may have a hexagonal shape. However, the drift regions 11 could also be implemented with other shapes, such as elliptical, rectangular, octagonal, or other polygonal shapes as well.

Figure 10:
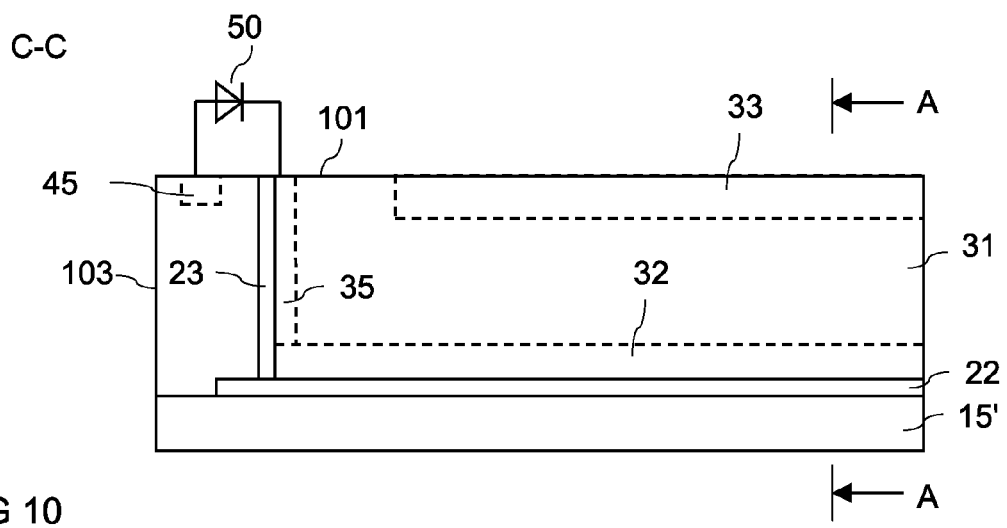
FIG. 10 illustrates a vertical cross sectional view of one embodiment of the semiconductor device of FIG. 4 in a section plane C-C.

FIG. 10 shows a vertical cross sectional view of a MOSFET with longitudinal drift control regions 31 in a section plane C-C that goes through the drift control region 31. Referring to FIG. 10, the rectifier element 50 can be connected to the drift control region 31 via the first surface 101. In the embodiment of FIG. 10, the drain electrode 15' is also arranged below the drift control region 31 but is dielectrically insulated from the drift control region by the further dielectric layer 22. Thus, the drift control region 31 is arranged in a "dielectric well" that includes the drift control region dielectric 21 (not illustrated in FIG. 10), the dielectric 23 at the longitudinal ends (where in FIG. 10 only one longitudinal end is illustrated) and the further dielectric layer 22 at the bottom of the drift control region dielectric. The rectifier element 50 is connected between the drain region 15 and a further connection zone 35. The further connection zone has the same doping type as the connection zone 32 and may extend from the first surface 101 along the dielectric layer 23 at the longitudinal end to the connection zone 32, so as to connect the rectifier element to the connection zone 32 at the drain-sided end of the MOSFET. However, the further connection region 35 may only be located close to the first surface 101. The optional semiconductor region 33 is distant to the vertical connection region 35. The vertical dielectric layer 23 at the longitudinal end can be produced using the same process steps as the vertical dielectric layers 21 explained herein before.

The vertical dielectric layer 23 may be present also without the rectifier element 50 and/or the vertical connection region 35. The vertical dielectric layer 23 may end above the further dielectric layer 22 as shown in FIG. 10, but may also end right at the lateral end of the further dielectric layer 22. The vertical dielectric layer 23 may exhibit the same structure and shapes like the first and second vertical dielectric layer $21_1$, $21_2$.

Referring to FIG. 10, the rectifier element 50 is connected between a contact region 45 at the first surface 101 and the vertical connection region 35. The contact region 45 is located in an edge region of the semiconductor body 100. The edge region of the semiconductor body 100 is a region adjoining a vertical edge 103 of the semiconductor body 100. The vertical edge 103 terminates the semiconductor body 100 in a horizontal direction. In this embodiment, the further dielectric layer 23 does not extend to the vertical edge. Thus, the drain region 15 is in contact with the edge region in which the contact region 45 is located and is electrically connected to the diode 50 via the edge region and the contact region 45.

The semiconductor device of FIG. 7 includes a device structure in which a first semiconductor region including the drift control region 31 (and optional regions 32, 33) is dielectrically insulated by a vertical dielectric layer 21 from a second semiconductor region including the drift region 11, the body region 12, and the drain region 15, and in which the drift control region 31 is dielectrically insulated from the drain electrode 15' by a horizontal dielectric layer 22.

One embodiment of a method for producing such a device structure is explained with reference to FIGS. 11A to 11E below. Each of these figures illustrates a vertical cross sectional view of the semiconductor body 100 after individual process steps.

Figure 11A:
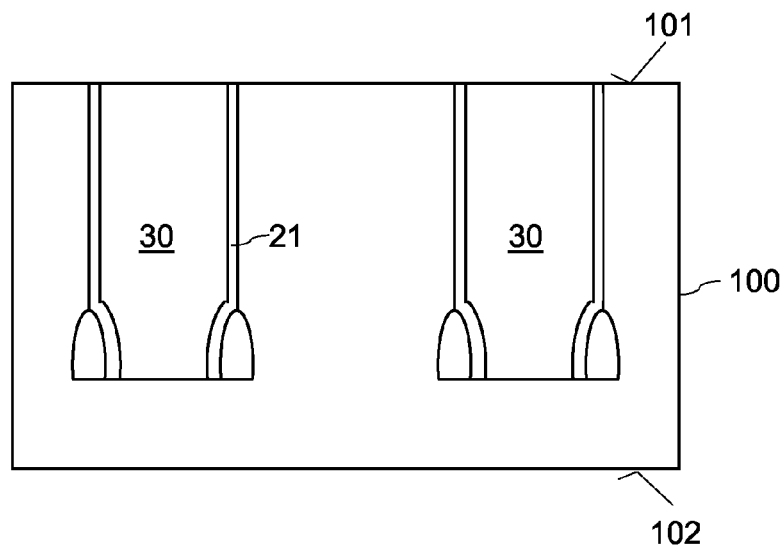
FIG. 11 (which includes FIGS. 11A to 11E) illustrates one embodiment of a method for producing a basic topology of the semiconductor device of FIG. 4.

Referring to FIG. 11A, the method includes providing a semiconductor body 100 with several vertical dielectric layers 21, wherein each of these vertical dielectric layers 21 is arranged between a semiconductor filling material 30 and semiconductor regions of the semiconductor body 100. Although the vertical dielectric layers 21 of FIG. 11A correspond to the vertical dielectric layers illustrated in FIG. 1G, vertical dielectric layers as explained with reference to FIG. 6E may be used as well.

Figure 11B:
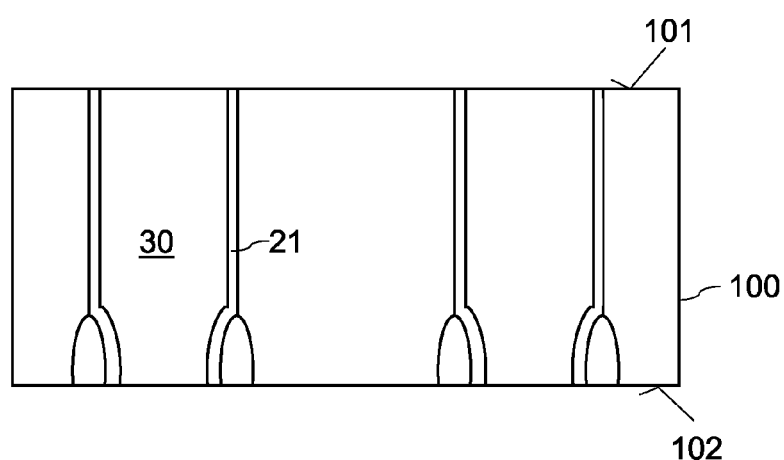

The semiconductor body 100 has a second surface 102 opposite the first surface 101. Referring to FIG. 11B, beginning at the second surface 102 semiconductor material of the semiconductor body 100 is removed down to the vertical dielectric layers 21. That is, the vertical dielectric layers 21 are exposed at the second surface 102. Removing semiconductor material of the semiconductor body 100 may include one of a polishing process, and an etching process.

Figure 11C:
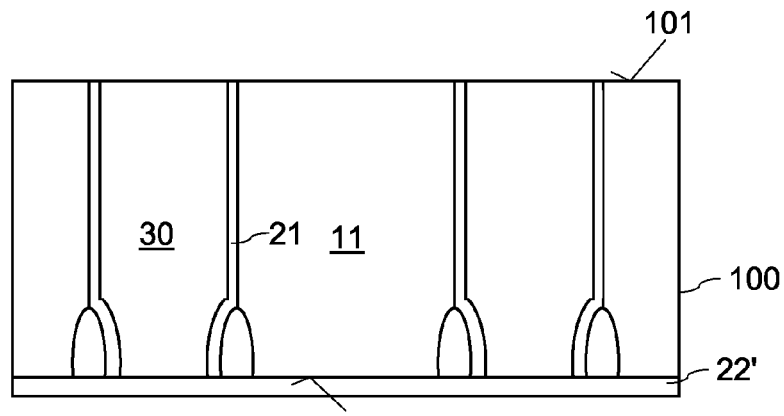

Referring to FIG. 11C, a dielectric layer 22' is formed on the second surface 102. In the present embodiment, the dielectric layer 22' completely covers the second surface 102. For explanation purposes it is assumed that the drift control region (31 in FIG. 7) of the MOSFET is formed in the semiconductor filling material 30, while the drift region 11, the body region 12 and the source region 12 are formed in semiconductor regions of the semiconductor body 100. These regions are labeled with reference characters 11' in the drawings, and will be referred to as semiconductor body regions in the following. It goes without saying that it is also possible to implement the drift control regions 32 in the semiconductor body regions 11' and to implement the drift regions 11, the body regions 12 and the source regions 13 in the (monocrystalline) filling material.

According to one embodiment, the semiconductor body 100 has a basic doping corresponding to the desired doping of the drift region 11. In this case, additional doping processes are only required for forming the body regions 12, the source regions 13 and the drain regions 15, while those regions that are not subject to a further doping form the drift region 11. Further, the semiconductor filling material 30 can be produced with a doping concentration corresponding to desired doping concentration of the drift control region 31. Referring to the explanation above, the doping concentration of the filling material may be adjusted during an epitaxial growth process.

Figure 11D:
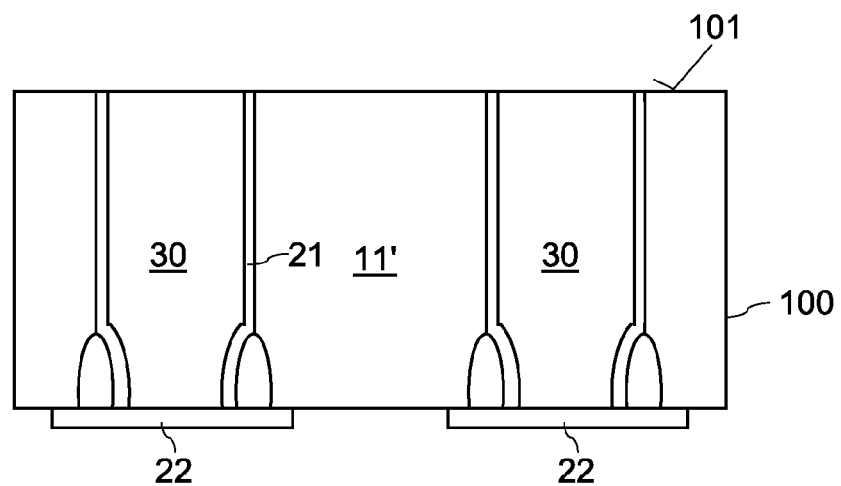

Referring to FIG. 11D, openings are formed in the dielectric layer 22 below the semiconductor body regions 11', so that the horizontal dielectric layers 22 remain below the semiconductor filling materials 30.

Figure 11E:
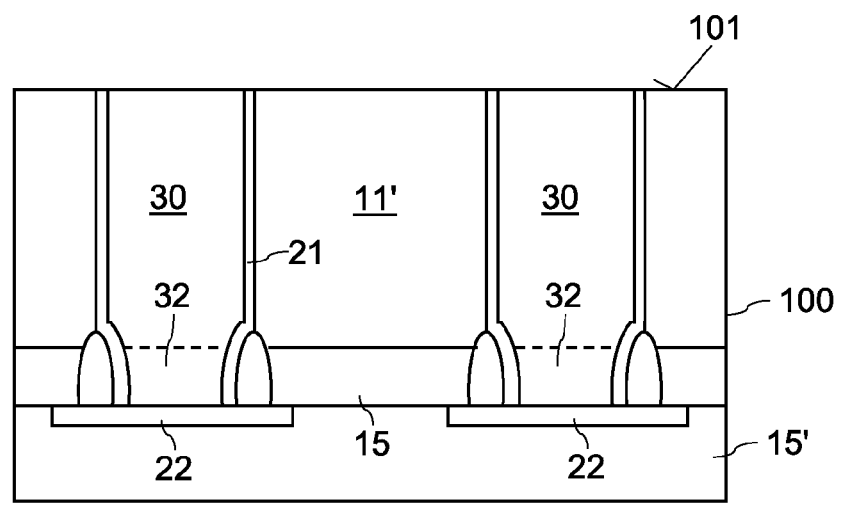

Referring to FIG. 11E, the drain electrode 15' is formed on uncovered regions of the semiconductor body regions 11' and the horizontal dielectric layers 22. Before forming the drain electrode 15', the drain regions 15 can be formed by an implantation and/or diffusion process. Equivalently, the optional semiconductor regions 32 can be formed in the semiconductor filling material by way of an implantation and/or diffusion process before forming the horizontal dielectric layers 22, and/or by an implantation process after the horizontal dielectric layers 22 have been formed.

In order to obtain the device of FIG. 7 from the device structure in FIG. 11E, the body regions 12, source regions 13 and the gate electrode 17 with the gate dielectric 18 can be produced using conventional MOSFET manufacturing processes. Further, the optional semiconductor region 33 adjoining the drift control region 31 can be produced using an implantation or diffusion process. Those regions of the semiconductor filling material 30 are not subject to a further doping form the drift control region 32.

FIGS. 12A to 12F illustrate an alternative embodiment of a method for producing a semiconductor device. In this method, a thicker portion of the vertical dielectric layer 21 adjoins the first surface 101 of the semiconductor body 100. This method includes forming the first trench 103 (see FIG. 12A) and forming a protection layer 212' on at least one of the sidewalls of the trench 103, wherein the at least one protection layer completely covers the at least one sidewall and optionally also covers the bottom of the trench 103.

Figure 12A:
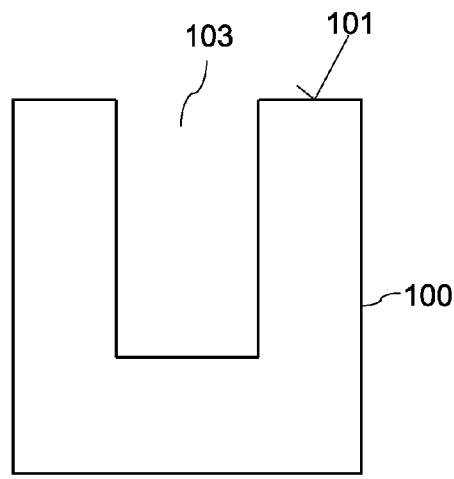
FIG. 12 (that includes FIGS. 12A to 12F) illustrates a further embodiment of a method for producing a semiconductor device with a vertical dielectric layer.
Figure 12B:
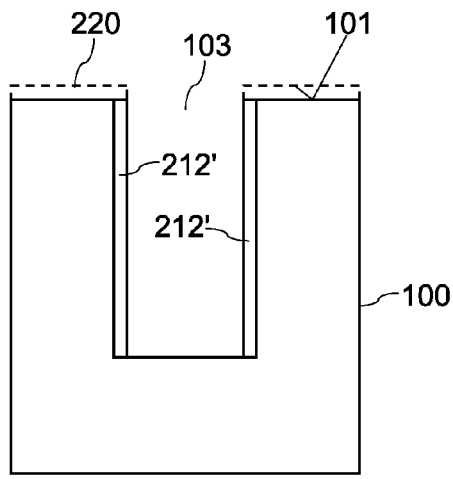
Figure 12C:
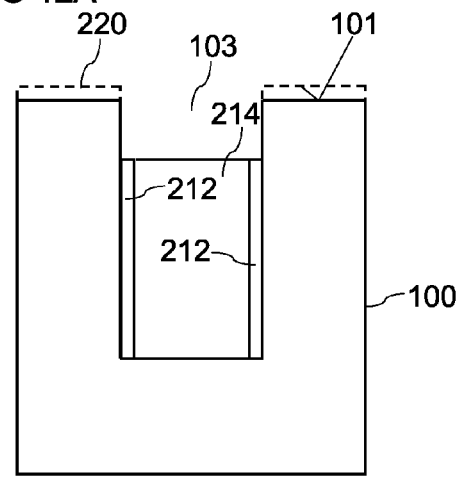

Referring to FIG. 12C, the protection layer 212' is removed from the at least one sidewall in an upper portion of the first trench 103, which is a portion close to the first surface 101. The resulting protection layer 212 leaves a section of the at least one sidewall close to the first surface 101 uncovered. Forming the protection layer 212 such that an upper section of the at least one sidewall is uncovered, may include forming a plug 214 that partially fills the trench 103, and removing the protection layer 212' in those sections not covered by the plug 214.

Figure 12D:
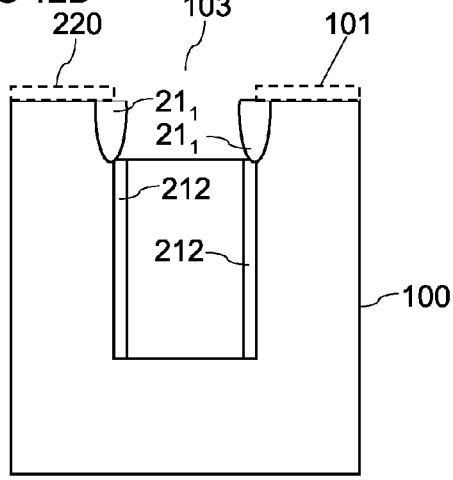
Figure 12E:
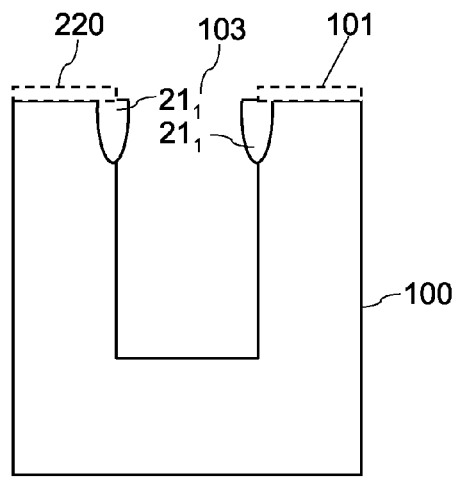
Figure 12F:
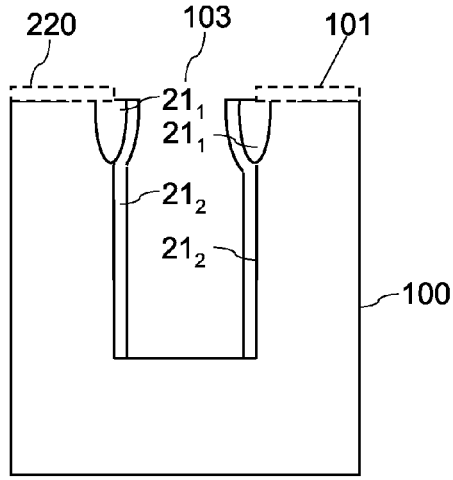

Referring to FIG. 12D, uncovered sidewall sections are oxidized, thereby forming the first dielectric layer section $21_1$. Then, referring to FIGS. 12E and 12F, the protection layer 212 is removed (see FIG. 12E), and the second dielectric layer section $21_2$ is formed.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a semiconductor device, comprising:
   providing a semiconductor body having a first surface;
   producing a first trench having a bottom and sidewalls and extending from the first surface into the semiconductor body;
   forming a dielectric layer along at least one sidewall of the first trench; and
   filling the first trench with a filling material,
   wherein forming the dielectric layer comprises:
      forming a protection layer on the least one sidewall such that the protection layer uncovers a section of the at least one sidewall that adjoins the bottom;
      oxidizing the semiconductor body in the region of the uncovered sidewall section to form a first section of the dielectric layer;
      removing the protection layer; and
      forming a second section of the dielectric layer on the at least one sidewall,
   wherein forming the protection layer comprises:
      forming a further protection layer on the bottom of the first trench such that the further protection layer covers a section of the at least one sidewall;
      forming the protection layer on those sections of the at least one sidewall that are not covered by the further protection layer; and
      removing the further protection layer.

2. The method of claim 1, wherein the filling material is selected from the group consisting of:
   a semiconductor material; and
   a conductor material.

3. The method of claim 2, wherein the conductor material is selected from the group consisting of:
   a metal;
   a nitride;
   carbon; and
   a metal silicide.

4. The method of claim 3, wherein the metal is selected from the group consisting of:
   aluminum (Al);
   copper (Cu);
   nickel (Ni);
   titanium (Ti);
   gold (Au); and
   silver (Ag).

5. The method of claim 2, wherein the semiconductor material is selected from the group consisting of:
   silicon (Si);
   silicon carbide (SiC);
   gallium nitride (GaN); and
   gallium arsenide (GaAs).

6. The method of claim 1, further comprising:
   forming the dielectric layer on each of the sidewalls.

7. The method of claim 1, wherein forming the first section of the dielectric layer comprises:
   oxidizing the uncovered sidewall section and the bottom to form the first section of the dielectric layer and to form an oxide layer on the bottom; and
   removing the oxide layer from the bottom.

8. The method of claim 1, wherein forming the dielectric layer on the at least one sidewall further comprises:
   forming a sacrificial layer on the at least one sidewall after forming the first section of the dielectric layer;
   filling the first trench with the filling material and at least partly removing the sacrificial layer so as to form a second trench; and
   filling the second trench with the second section of the dielectric layer.

9. The method of claim 8, wherein filling the second trench with the second section of the dielectric layer comprises an oxidation process.

10. The method of claim 8, wherein removing the sacrificial layer comprises a selective etching process.

11. The method of claim 8, wherein the sacrificial layer comprises a first oxide layer on the at least one sidewall, a carbon layer on the first oxide layer, and a second oxide layer on the carbon layer.

12. The method of claim 11, wherein at least partly removing the sacrificial layer comprises ashing the carbon layer.

13. The method of claim 1, wherein the protection layer comprises a nitride.

14. The method of claim 1, wherein two dielectric layers are formed at least on two opposite sidewalls of the first trench, and wherein the method further comprises:
  removing material of the semiconductor body in a region adjoining a second surface opposite the first surface such that the two dielectric layers are uncovered in the region of the second surface; and
  forming a further dielectric layer on the second surface such that the further dielectric layer extends from a first one of the dielectric layers to a second one of the dielectric layers in a lateral direction of the semiconductor body.

15. The method of claim 14, further comprising:
  forming an electrode layer on the second surface such that the electrode layer electrically contacts a region of the semiconductor body adjoining one of the dielectric layers.

16. The method of claim 1, further comprising:
  forming a sacrificial filling material that closes the first trench after forming the dielectric layer and before forming the filling material; and
  removing the sacrificial filling material before forming the filling material.

17. A method for producing a semiconductor device, comprising:
  providing a semiconductor body having a first surface;
  producing a first trench having a bottom and sidewalls and extending from the first surface into the semiconductor body;
  forming a dielectric layer along at least one sidewall of the trench; and
  filling the trench with a filling material,
  wherein forming the dielectric layer comprises:
    forming a protection layer on the least one sidewall such that the protection layer leaves a section of the at least one sidewall uncovered;
    oxidizing the semiconductor body in the region of the uncovered sidewall section to form a first section of the dielectric layer; and
    removing the protection layer,
  wherein the uncovered sidewall section adjoins the bottom and wherein forming the first section of the dielectric layer comprises:
    oxidizing the uncovered sidewall section and the bottom to form the first section of the dielectric layer and to form an oxide layer on the bottom; and
    removing the oxide layer from the bottom.

18. A method for producing a semiconductor device, comprising:
  providing a semiconductor body having a first surface;
  producing a first trench having a bottom and sidewalls and extending from the first surface into the semiconductor body;
  forming a dielectric layer along at least one sidewall of the trench; and
  filling the trench with a filling material,
  wherein forming the dielectric layer comprises:
    forming a protection layer on the least one sidewall such that the protection layer leaves a section of the at least one sidewall uncovered;
    oxidizing the semiconductor body in the region of the uncovered sidewall section to form a first section of the dielectric layer;
    removing the protection layer;
    forming a second section of the dielectric layer on the at least one sidewall;
    forming a sacrificial layer on the at least one sidewall after forming the first section of the dielectric layer;
    filling the first trench with the semiconductor material and at least partly removing the sacrificial layer so as to form a second trench; and
    filling the second trench with the second section of the dielectric layer.

* * * * *